United States Patent
Okamoto et al.

(10) Patent No.: US 9,818,657 B2
(45) Date of Patent: Nov. 14, 2017

(54) DRY ETCHING METHOD AND METHOD OF MANUFACTURING SEMICONDUCTOR DEVICE

(71) Applicant: Renesas Electronics Corporation, Tokyo (JP)

(72) Inventors: Keiji Okamoto, Tokyo (JP); Kazuyuki Ozeki, Tokyo (JP); Hiromasa Arai, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 41 days.

(21) Appl. No.: 14/899,626

(22) PCT Filed: Jun. 21, 2013

(86) PCT No.: PCT/JP2013/067129
§ 371 (c)(1),
(2) Date: Dec. 18, 2015

(87) PCT Pub. No.: WO2014/203400
PCT Pub. Date: Dec. 24, 2014

(65) Prior Publication Data
US 2016/0148851 A1    May 26, 2016

(51) Int. Cl.
*H01L 21/302* (2006.01)
*H01L 21/461* (2006.01)
(Continued)

(52) U.S. Cl.
CPC ........ *H01L 22/26* (2013.01); *H01L 21/32136* (2013.01); *H01L 21/32137* (2013.01);
(Continued)

(58) Field of Classification Search
None
See application file for complete search history.

(56) References Cited

U.S. PATENT DOCUMENTS

| | | | |
|---|---|---|---|
| 2002/0119660 A1* | 8/2002 | Sarfaty | H01L 22/26 438/689 |
| 2009/0162950 A1 | 6/2009 | Kuboi et al. | |
| 2010/0003823 A1* | 1/2010 | Chen | H01L 21/3085 438/701 |

FOREIGN PATENT DOCUMENTS

| | | |
|---|---|---|
| JO | 08-288258 | * 11/1996 |
| JP | 4-94533 A | 3/1992 |

(Continued)

OTHER PUBLICATIONS

International Search Report for PCT/JP2013/067129 dated Sep. 17, 2013 [PCT/ISA/210].
(Continued)

*Primary Examiner* — Stephanie Duclair
(74) *Attorney, Agent, or Firm* — Sughrue Mion, PLLC

(57) ABSTRACT

A first etching rate of the first conductive film is calculated by acquiring correlation between an opening ratio of an etching mask and an etching rate of an etching target film, and then, performing a first dry etching to a first conductive film formed on a first wafer. Next, a second etching mask is formed on a second conductive film formed on a second wafer, and an etching time of the second conductive film is determined from the correlation between the opening ratio and the etching rate, the first etching rate, and a film thickness of the second conductive film when the second conductive film is subjected to a second dry etching in time-controlled etching.

7 Claims, 12 Drawing Sheets

(51) Int. Cl.
| | |
|---|---|
| C03C 15/00 | (2006.01) |
| C03C 25/68 | (2006.01) |
| C23F 1/00 | (2006.01) |
| B44C 1/22 | (2006.01) |
| H01L 21/66 | (2006.01) |
| H01L 29/49 | (2006.01) |
| H01L 27/12 | (2006.01) |
| H01L 21/3213 | (2006.01) |
| H01L 27/11573 | (2017.01) |
| H01L 29/423 | (2006.01) |
| H01L 27/11 | (2006.01) |
| H01L 29/43 | (2006.01) |

(52) U.S. Cl.
CPC ........ *H01L 21/32139* (2013.01); *H01L 22/20* (2013.01); *H01L 27/11573* (2013.01); *H01L 27/12* (2013.01); *H01L 29/42328* (2013.01); *H01L 29/49* (2013.01); *H01L 22/12* (2013.01); *H01L 27/1104* (2013.01); *H01L 29/435* (2013.01)

(56) References Cited

FOREIGN PATENT DOCUMENTS

| | | |
|---|---|---|
| JP | 08-288258 A | 11/1996 |
| JP | 2004-228605 A | 8/2004 |
| JP | 2009-152269 A | 7/2009 |

OTHER PUBLICATIONS

Written Opinion for PCT/JP2013/067129 dated Sep. 17, 2013 [PCT/ISA/237].
Communication dated Aug. 23, 2016, from the Japanese Patent Office in counterpart Japanese application No. 2015-522459.

* cited by examiner

DRY ETCHING METHOD AND METHOD OF MANUFACTURING SEMICONDUCTOR DEVICE

CROSS REFERENCE TO RELATED APPLICATIONS

This application is a National Stage of International Application No. PCT/JP2013/067129 filed Jun. 21, 2013, the contents of all of which are incorporated herein by reference in their entirety.

TECHNICAL FIELD

The present invention relates to a dry etching method and a method of manufacturing a semiconductor device, and, more particularly, the present invention relates to a method of manufacturing a semiconductor device having a non-volatile memory.

BACKGROUND ART

A manufacturing process of a semiconductor device includes, for example, an impurity implantation process to a semiconductor substrate, a film deposition process, a lithography process of transferring a mask pattern to a photoresist, an etching process of processing a thin film deposited by using the mask pattern as an etching mask, a rinsing process, and others.

In the etching process, a dry etching technique is indispensable in order to form a fine pattern.

The semiconductor device is configured of a plurality of MISFETs (Metal Insulator Semiconductor Field Effect Transistors). Each MISFET has a source region, a drain region and a gate electrode, and the dry etching technique is used in order to form the gate electrode. For example, the gate electrode is formed by forming a resist mask having a desired mask pattern on a polysilicon film formed on a surface of the semiconductor substrate through a gate insulating film such as an oxide film in a lithography process, and dry-etching the polysilicon film of a part exposed from the resist mask.

In the dry etching process, a technique of controlling a processing dimension of the gate electrode, or a technique of detecting an end point of the dry etching in order to reduce an etching damage on the oxide film of a base or the semiconductor substrate due to over-etching is used.

However, in the dry etching process, it becomes more difficult to control the processing dimension and detect the end point as an opening ratio of the etching mask is smaller.

Japanese Patent Application Laid-Open Publication No. 2009-152269 (Patent Document 1) describes a technique of controlling a variation of the processing dimension by correcting an etching condition depending on the opening ratio and a solid angle of a local pattern.

PRIOR ART DOCUMENT

Patent Document

Patent Document 1: Japanese Patent Application Laid-Open Publication No. 2009-152269

SUMMARY OF THE INVENTION

Problems to be Solved by the Invention

As a dry etching method used when the opening ratio is small and the end point is difficult to be detected, a time-controlled etching has been studied, the time-controlled etching of ending the etching by using etching time which is previously calculated from a film thickness of an etching target film and an etching rate of the film.

Even in the time-controlled etching, the etching rate is supposed to be constant every time as long as a used dry etching apparatus, a used etching condition, a film type and a film property of the etching target film, and others are constant. Therefore, even when the above-described gate electrode is processed, a desired processing accuracy can be secured, and an etching damage in the oxide film of the base or the semiconductor substrate can be reduced.

However, by the study of the inventors of the present application, it has been found out that there is a problem that the etching rate of the dry etching apparatus, supposed to be constant, changes, the processing dimension of the gate electrode changes, and a threshold value of the MISFET changes, which results in decrease in the reliability of the semiconductor device.

The other problems and novel characteristics will be apparent from the description of the present specification and the accompanying drawings.

Means for Solving the Problems

According to one embodiment, a first etching rate of a first conductive film is calculated by acquiring a correlation between an opening ratio of an etching mask and an etching rate of an etching target film, and performing a first dry etching to the first conductive film formed on a first wafer. Next, a second etching mask is formed on a second conductive film formed on a second wafer, and etching time of the second conductive film is determined by the correlation between the opening ratio and the etching rate, the first etching rate, and a film thickness of the second conductive film when a second dry etching is performed to the second conductive film in time-controlled etching.

Effects of the Invention

According to one embodiment, a semiconductor device with high reliability can be provided.

BRIEF DESCRIPTIONS OF THE DRAWINGS

BEST MODE FOR CARRYING OUT THE INVENTION

Hereinafter, embodiments of the present invention will be described in detail with reference to the accompanying drawings. Note that the same components are denoted by the same reference symbols in principle throughout all the drawings for describing the embodiments, and the repetitive description thereof will be omitted.

First Embodiment

Figure 1:
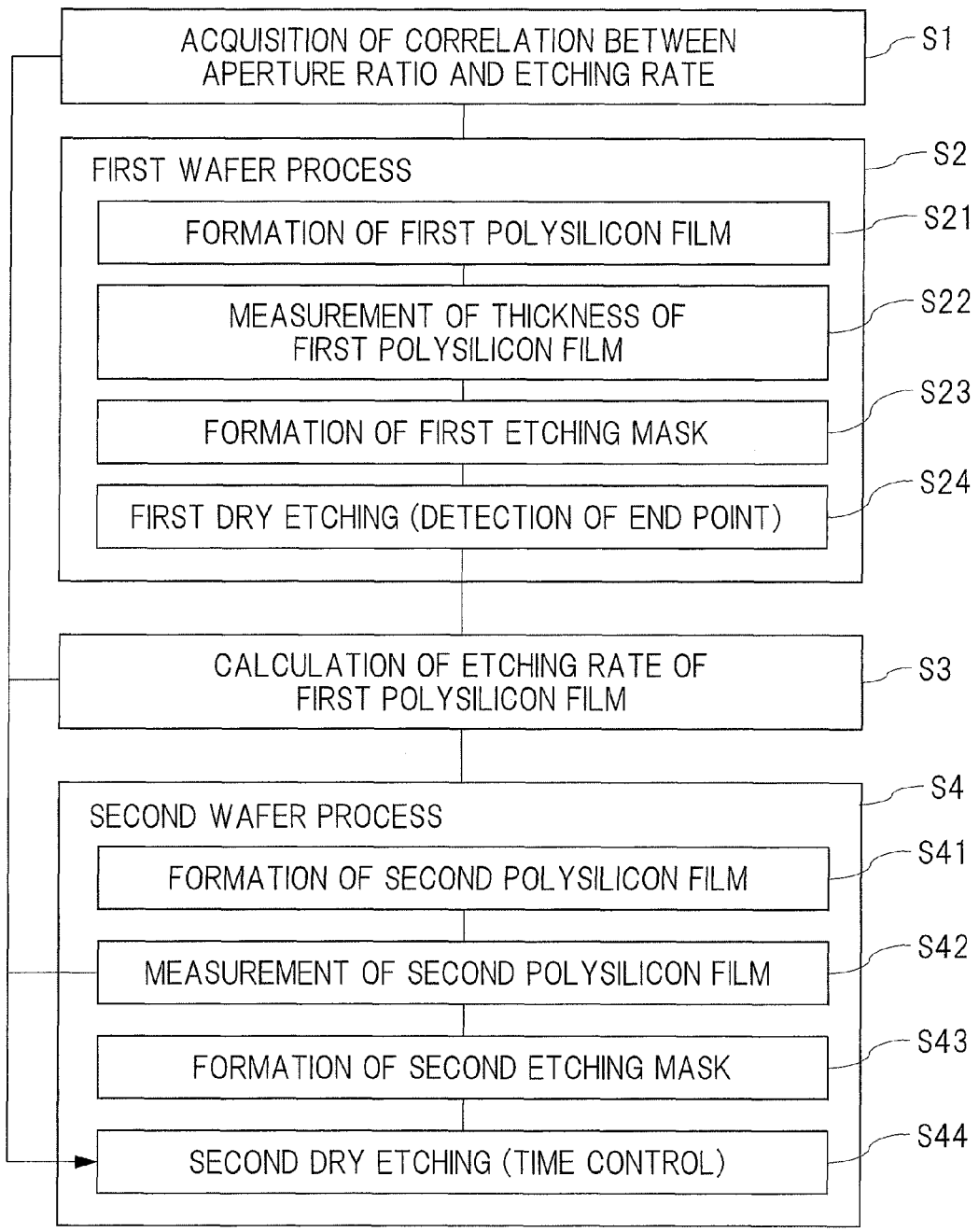
FIG. 1 is a process flow illustrating a dry etching method according to a first embodiment.
Figure 2:
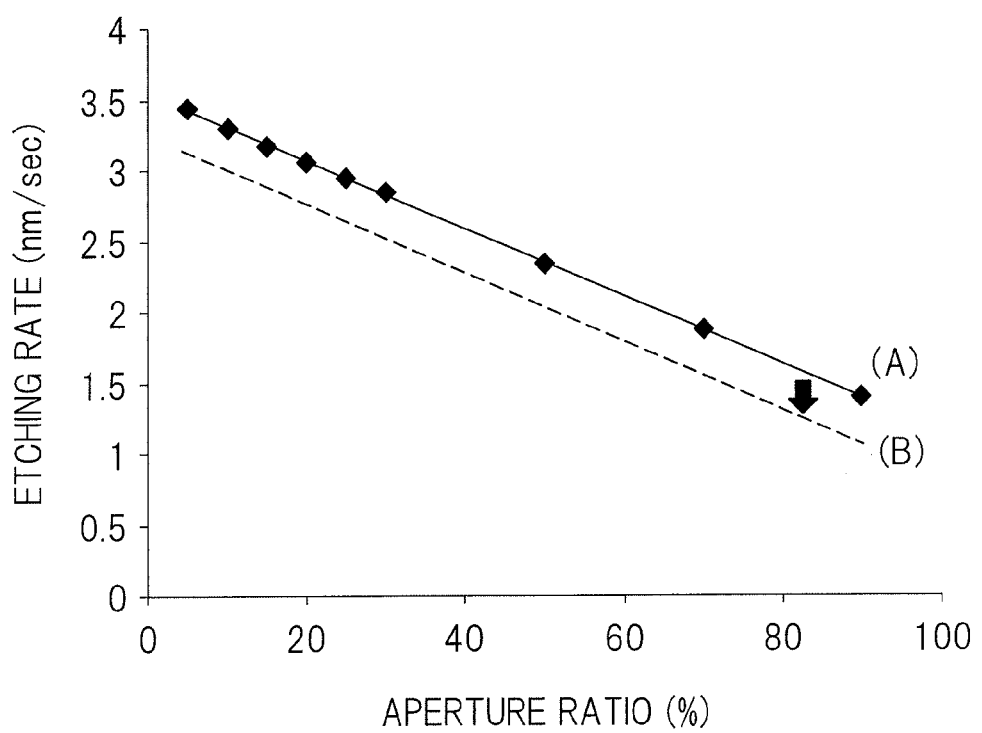
FIG. 2 is a graph illustrating a correlation between of an opening ratio and an etching rate of a dry etching apparatus according to the first embodiment.
Figure 3A:
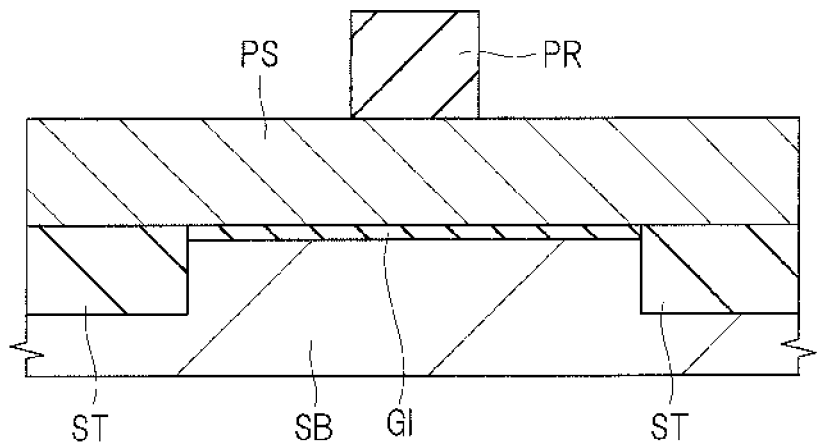
FIGS. 3A to 3C are cross-sectional views of a principal part of a manufacturing process of a semiconductor device according to the first embodiment.
Figure 3B:
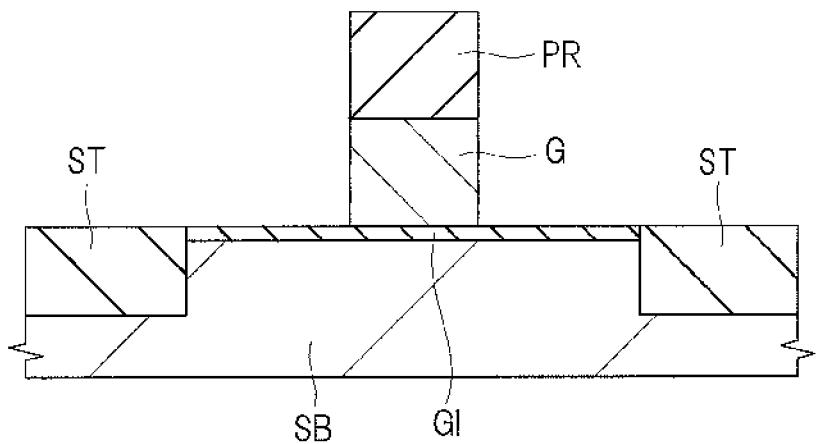
Figure 3C:
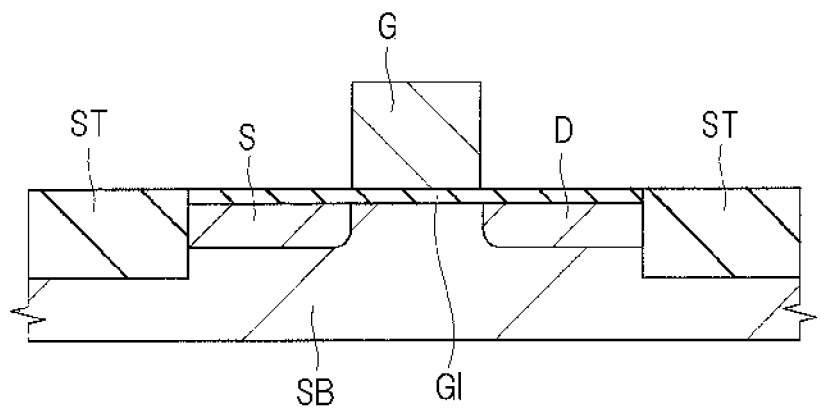
Figure 4A:
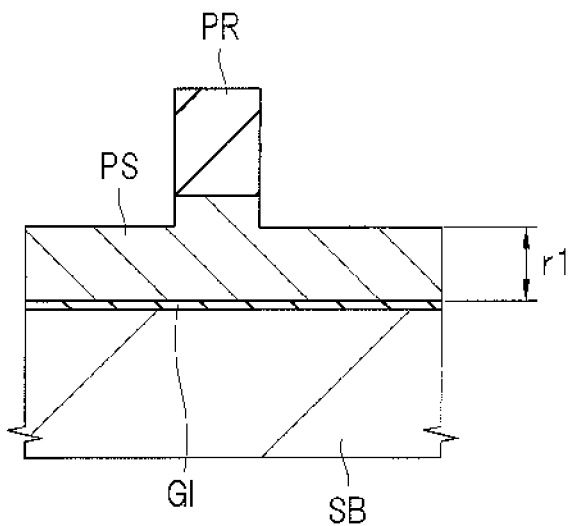
FIGS. 4A and 4B are cross-sectional views of a principal part for describing a method of calculating the etching rate in the dry etching method according to the first embodiment.
Figure 4B:
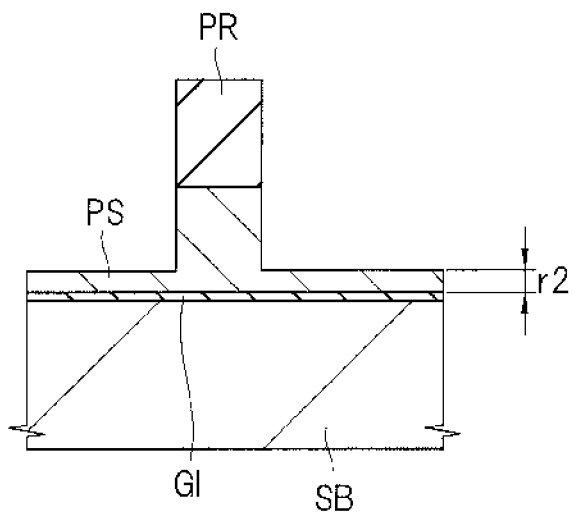

FIG. 1 is a process flow illustrating a dry etching method of a semiconductor device according to the first embodiment. FIG. 2 is a graph illustrating an example of correlation between of an opening ratio of an etching mask and an etching rate of an etching target film in a dry etching apparatus according to the first embodiment. FIGS. 3A to 3C are cross-sectional views of a principal part of a main process in a method of manufacturing the semiconductor device according to the first embodiment. FIGS. 4A and 4B are cross-sectional views of a principal part for describing a method of calculating the etching rate in the dry etching method according to the first embodiment.

The semiconductor device according to the present embodiment has an n-channel MISFET and a p-channel MISFET, and a manufacturing process thereof will be described by using the n-channel MISFET. The n-channel MISFET has an n-type source region, an n-type drain region and gate electrode.

As illustrated in FIG. 3A, first, a semiconductor substrate (semiconductor wafer) SB made of p-type monocrystalline silicon or others is prepared, and an element isolation region ST that defines an active region is formed on a main surface of the semiconductor substrate SB. Although not illustrated, a periphery of the active region is surrounded by the element isolation region ST when seen in a plan view, and one or a plurality of the MISFETs are formed in one active region. A plurality of regions (referred to as a chip region) each of which has one semiconductor device formed thereon are arranged in a matrix form on the semiconductor substrate (semiconductor wafer) SB.

The element isolation region ST is made of an insulator such as silicon oxide, which is selectively formed in a trench provided on the main surface of the semiconductor substrate SB, and an upper surface of the element isolation region ST and the main surface of the semiconductor substrate SB have substantially the same height as each other.

Next, an insulating film GI used for a gate insulating film is formed on the main surface of the semiconductor substrate SB. The insulating film GI is made of, for example, a thin silicon oxide film or silicon oxynitride film, and a film thickness thereof is about 2 to 3 nm.

Next, a polysilicon film (polycrystalline silicon film) PS is formed on the insulating film GI and the element isolation region ST of the main surface of the semiconductor substrate SB by using, for example, a CVD (chemical vapor deposition) method or others, and is formed so as to have a film thickness of about 100 to 150 nm.

Next, a resist mask PR, which has a pattern corresponding to a gate electrode pattern, is selectively formed on the polysilicon film PS by using a photolithography technique. The resist mask PR is made using a photoresist film.

The resist mask PR is formed on the main surface of the semiconductor substrate (semiconductor wafer) SB with a predetermined opening ratio. Here, the opening ratio is a ratio of a region exposed from the resist mask PR when viewed in a unit of chip, and is defined so that the opening ratio "OPR=(the area of the region exposed from the etching mask such as the resist mask: EXP)/(the area of a chip main surface: SA)".

As illustrated in FIG. 3B, the polysilicon film PS is subjected to dry etching. A gate electrode G is formed by selectively leaving the polysilicon film PS below the resist mask PR by removing the polysilicon film PS of a part not covered by the resist mask PR. As gas types used at this time, hydrogen bromide (HBr), oxygen ($O_2$), and chlorine ($Cl_2$) are used. Here, the resist mask PR functions as the etching mask.

Next, as illustrated in FIG. 3C, the n-channel MISFET can be formed by removing the resist mask PR by using asking or others, and then, forming an n-type source region S, and an n-type drain region D, which are n-type semiconductor regions, on a surface of the semiconductor substrate SB at both sides of the gate electrode G.

Here, in the dry etching process of the polysilicon film PS, a technique of controlling a processing dimension of the gate electrode G, and a technique of detecting an end point of the dry etching in order to reduce an etching damage of the insulating film GI of a base or the semiconductor substrate SB due to over-etching is used.

As the technique of detecting the end point, a surface of the polysilicon film PS, which is an etching target film, is irradiated with white light, and reflection light L1 from the surface of the polysilicon film PS and reflection light L2 reflected from an interface between the insulating film GI of the base and the polysilicon film PS after passing through the polysilicon film PS are detected. And, the end point detection technique using an interference waveform for calculating the etching end point of the polysilicon film PS by detecting a film thickness of the polysilicon film PS remaining based on a phase difference between both the reflection light L1 and L2 is used.

If the opening ratio is large, the dry etching can be achieved by using the end point detection technique. However, when the opening ratio is small, more particularly when the opening ratio is equal to or smaller than 20%, it is difficult to use the endpoint detection technique. Accordingly, time-controlled etching which ends the etching by using the previously-calculated etching time is performed.

In the following description, note that a large opening ratio means to be larger than 20%, and a small opening ratio means to be equal to or smaller than 20%.

Hereinafter, the explanation will be made about the dry etching method of the polysilicon film PS by using the time-controlled etching which can provide the semiconductor device with high reliability.

The explanation will be made about the dry etching method of the polysilicon film PS used when the opening ratio is small with reference to FIGS. 1 and 2.

First, as illustrated in Step S1 of FIG. 1, a unique correlation between the etching rate and the opening ratio for the device is acquired when an etching condition, the etching target film, and others are fixed by using the dry etching apparatus having end point detection means.

The correlation is saved as data in a host computer to which a calculation and memory unit included in the dry etching apparatus or a plurality of manufacturing apparatuses such as the dry etching apparatus is connected. Hereinafter, the host computer is represented by "host" in term of the inclusion of both of them, and the control relating to memory and calculation of the data acquired in FIG. 1 and to the etching or others is performed in the host.

A step S1 can be executed as, for example, follows.

A wafer having the resist mask PR having a desired opening ratio formed on the polysilicon film PS which is the etching target film is prepared, and the dry etching is performed by using the end point detection means. Since time taken from start to end of the etching of the polysilicon film PS can be acquired by the end point detection means, the etching rate is calculated from the obtained etching time and the film thickness of the polysilicon film PS. The correlation between the opening ratio and the etching rate is acquired by executing such a process to a plurality of the wafers having different opening ratios from each other.

When the opening ratio is, for example, larger than 20%, the etching rate is acquired by the above-described method using a product wafer or a wafer for data acquisition having a desired opening ratio. When the opening ratio is equal to or smaller than 20%, the etching rate is acquired by preparing the wafer for data acquisition. In this case, the etching rate is acquired by, for example, using the wafer for data acquisition formed with a dedicated region (several cm×several cm) for the end point detection based on the interference waveform inside the wafer for data acquisition, and formed with patterns having the opening ratio larger than 20% in the dedicated region and having the opening ratio equal to or smaller than 20% in the other chip region.

An example of a relational expression between an opening ratio (OPR) and an etching rate (ER) acquired as described above is indicated by a solid line (A) in FIG. 2. The relational expression indicated by the solid line (A) is expressed as "the etching rate (ER)=a (opening ratio (OPR))+b (a=−0.024, b=3.54)". In the following description, the solid line (A) of FIG. 2 is represented as a "correlation (A)".

The correlation (A) is unique for the etching apparatus, and the correlation (A) is maintained when the same-type etching targets are etched under the same etching conditions as each other. Therefore, even in the time-controlled etching, a dimension and a shape obtained after the etching of the etching target film are supposed to be correctly controlled by using the correlation (A) of FIG. 2.

However, by the study of the inventors of the present application, it has been found out from the correlation (A) acquired in FIG. 2 that the one having the shifted etching rate is caused by repeatedly performing the time-controlled etching in the etching apparatus. As a result of the study of the inventors of the present application, it has been found out that a cause of the shift of the etching rate is due to time degradation of the etching apparatus or accessory parts, an etched material or an etching condition of previous etching. Further, it has been found out that the cause can be also due to a change in a gas flow rate, degradation/failure of a power supply system, a change in a vacuum leakage amount, a shift in pressure, a change in a wafer temperature, or the others.

In addition, the dry etching with the etching mask having the small opening ratio performed while using the etching rate of the correlation (A) regardless of the shift of the etching rate causes such a disadvantage that the processing shape and dimension of the formed film are changed. In the case of the dry etching for forming the gate electrode, a threshold value of the MISFET is changed.

Furthermore, when the dry etching with the etching mask having the small opening ratio is continuously performed while using the etching ratio of the correlation (A) without awareness of the shift of the etching rate, there is a risk of producing a large amount of defects.

The dry etching method and the method of manufacturing the semiconductor device as illustrated in the first embodiment aim to solve the problems described above.

Next, as illustrated in Step S2 of FIG. 1, a first wafer is processed. As described with reference to FIG. 3, the Step S2 includes Step S21 of forming a first polysilicon film on the first wafer having the insulating film GI provided on the surface of the semiconductor substrate SB, Step S22 of measuring a film thickness of the first polysilicon film, Step S23 of forming a first etching mask having a first opening ratio OPR1 on the first polysilicon film, and Step S24 of executing a first dry etching using the end point detection means on the first polysilicon film.

In Step S22 of measuring a film thickness d1 of the first polysilicon film, a publicly-known method of measuring a film thickness is used. For example, the interference waveform described in the end point detection means described above can be used.

Here, the first opening ratio OPR1 is larger than 20%, and the end point detection is possible in the first dry etching. An etching time T1 required for the etching of the first polysilicon film is obtained by using the end point detection means.

Next, as illustrated in Step S3 of FIG. 1, a first etching rate ER1 of the first polysilicon film is acquired from the film thickness d1 of the first polysilicon film and the etching time T1 of the first polysilicon film. These pieces of data are saved in the host at anytime so as to correspond to the dry etching apparatus, the etching condition, and others. Since such data is acquired and saved for all the wafer processes, the latest data of the etching rate is always saved in the host.

Next, a second wafer is processed as illustrated in step S4 of FIG. 1. Here, the second wafer is a product different from the first wafer described above. As described with reference to FIG. 3, Step S4 includes Step S41 of forming a second polysilicon film on the second wafer in which the insulating film GI is provided on the surface of the semiconductor substrate SB, and Step S42 of measuring a film thickness d2 of the second polysilicon film. Further, Step S4 includes Step S43 of forming a second etching mask having a second opening ratio OPR2 on the second polysilicon film, and Step S44 of executing a second dry etching using the time-controlled etching on the second polysilicon film.

The second polysilicon film is formed under the same deposition condition and has the same film property as those of the first polysilicon film of Step S21.

For example, in Step S42, the film thickness d2 of the second polysilicon film is acquired by using the same method as that of Step 22. Here, if the variation in the film thickness of the formed second polysilicon film is extremely small, the film-thickness measuring Step S42 can be eliminated, and the expected film thickness of the deposition of the second polysilicon film may be used.

In the second dry etching, the second opening ratio OPR2 is smaller than the first opening ratio OPR1, and the second opening ratio OPR2 is equal to or smaller than 20% at which the end point detection manes cannot be used in the dry etching, and therefore, the time-controlled etching is performed in the second dry etching step S44. An etching time T2 at this time is determined by using the correlation (A) between the opening ratio and the etching rate, the film thickness d2 of the second polysilicon film, and the first etching rate ER1 of the first polysilicon as illustrated in FIG. 1. Specifically, the etching time T2 is determined as follows.

First, a "shift amount (R)" of the etching rate ER1 of the first polysilicon film in the first opening ratio OPR1 obtained in Step S3 with respect to the correlation (A) between the opening ratio and the etching rate is acquired, and the following process is performed depending on a degree of the shift amount (R).

For example, when the shift amount (R) is within a first range (0≤|R|≤|R1|), there is no abnormality in the etching apparatus or the accessory equipment, and therefore, the etching time T2 is calculated from the second etching rate ER2 with respect to the second opening ratio acquired directly by using the correlation (A).

Next, when the shift amount (R) is within a second range (|R1|<|R|≤|R2|), it is determined that the etching rate is shifted while the etching apparatus or the accessory equipment is normal, and therefore, the corrected second etching rate ER2 is used. For example, the second etching rate ER2 is acquired by using a correlation (B) (indicated by a dashed line in FIG. 2) obtained by shifting the correlation (A) by |R| in the Y-axis direction.

Further, when the shift amount (R) is within a third range (|R|>|R2|), it is determined that there is an abnormality in the etching apparatus or the accessory equipment, and a cause of the abnormality is investigated and a countermeasure is taken for that without executing the second dry etching.

That is, the second etching rate ER2 used when the second polysilicon film of the second wafer is subjected to the second dry etching in the time-controlled etching by using the etching mask having the small opening ratio is determined depending on the first etching rate ER1 with respect to the first wafer acquired in the first dry etching with the large opening ratio.

Therefore, even when a slight shift is caused in the first etching rate ER1 due to the etching apparatus or the accessory equipment, the etching rate ER2 of the second dry etching with the small opening ratio can be appropriately set depending on the degree of the shift, and therefore, the present invention has an effect of allowing prevention or reduction of the change in the processing shape or dimension of the etching target film.

In addition, when the first etching rate ER1 is largely shifted from the correlation (A), it is determined that the abnormality is caused in the etching apparatus or the accessory equipment, and the second dry etching is not executed. Therefore, it is possible to eliminate the risk of producing the large amount of defects without the awareness of the change in the etching apparatus or the accessory equipment.

There is no problem if the first etching rate ER1 calculated in Step S3 is data before performing the second dry etching. However, if there are a plurality of pieces of data of the first etching rate ER1, it is desirable to use the latest data.

Note that the first dry etching and the second dry etching are performed in the same etching apparatus under the same etching condition (similar etching condition may be enough when knowing a relationship thereof) to the same type of etching target film. They can be different from each other in the film thickness of the etching target film and the opening ratio of the etching mask. In addition, they have a difference depending on a difference in the opening ratio in terms of whether the etching end point detection technique can be used or not. Since the etching is performed in the same apparatus, the first dry etching is performed first, and then, the second dry etching is performed.

Next, with reference to FIGS. 4A and 4B, the description will be made about a method of calculating the first etching rate ER1 in Step S3 of FIG. 1 when the opening ratio is large. Also in this case, the end point detection technique using the interference waveform is used.

FIG. 4A illustrates a state of the first end point after "t1" seconds from the start of the etching of the first polysilicon film PS, and it is assumed that a residual film thickness of the first polysilicon film PS, which remains without being etched in a region not covered by the etching mask PR, is "r1". FIG. 4B illustrates a state of the second end point after "t2" seconds after the start of the etching while proceeding the etching under the same condition after FIG. 4A, and it is assumed that a residual film thickness of the first polysilicon film PS, which remains without being etched in a region not covered by the etching mask PR, is "r2".

By acquiring the residual film thicknesses of the first polysilicon film PS and elapsed time from the start of the etching at the first end point and the second end point as described above, the etching rate ER1 can be acquired as "(r1−r2)/(t2−t1)". That is, the etching rate ER1 can be calculated without measuring the film thickness of the first polysilicon film PS formed in Step S21. Therefore, the Step S22 of measuring the film thickness of the first polysilicon film of FIG. 1 can be eliminated.

Although the description has been made by using the polysilicon film as the etching target film. However, another conductive film (such as a W film or an Al film) may be used. In addition, an insulating film such as the silicon oxide film ($SiO_2$), a silicon nitride film (SiN) or a Low-k film may be used.

According to the dry etching method and the method of manufacturing the semiconductor device of the present embodiment, the second etching rate ER2 used when the second conductive film of the second wafer is subjected to the second dry etching in the time-controlled etching is determined depending on the first etching rate ER1 acquired by the first dry etching using the end point detection means to the first wafer.

In addition, the second etching rate ER2 used when the second conductive film of the second wafer is subjected to the second dry etching using the etching mask with the small opening ratio is determined depending on the first etching rate ER1 acquired by the first dry etching with the large opening ratio to the first wafer.

Therefore, even when the slight shift is caused in the first etching rate ER1 due to the etching apparatus or the accessory equipment, the etching rate ER2 of the second dry etching with the small opening ratio can be appropriately set depending on the degree of the shift, and therefore, the present invention has the effect of allowing prevention or reduction of the change in the processing dimension of the etching target film.

In addition, the threshold value in the MISFET can be prevented from changing, so that the semiconductor device with the high reliability can be provided.

In addition, when the first etching rate ER1 is largely shifted from the correlation (A), it is determined that the abnormality is caused in the etching apparatus or the accessory equipment, and the second dry etching is not executed. Therefore, it is possible to eliminate the risk of producing the large amount of defects without the awareness of the change in the etching apparatus or the accessory equipment.

Second Embodiment

The present embodiment is a method of manufacturing a semiconductor device in which the dry etching method described in the above-described first embodiment is applied to a semiconductor device provided with a non-volatile memory (a non-volatile memory element, a flash memory, or a non-volatile semiconductor memory device).

This semiconductor device has a non-volatile memory array having a plurality of the non-volatile memories arranged in a matrix form, a first peripheral circuit to execute operations of read, write, erase, etc., of the non-volatile memory, and a second peripheral circuit that operates independently from the non-volatile memory. The first peripheral circuit includes a decoder, a sensing amplifier, etc., and the second peripheral circuit includes a core of a CPU (central processing unit), an SRAM, etc.

The non-volatile memory will be described by using a memory cell based on the n-channel MISFET. However, the p-channel MISFET may also be used. As illustrated in the cross-sectional view of the principal part of FIG. 16 described later, the non-volatile memory cell has a structure in which two gate electrodes of a control gate electrode CG and a memory gate electrode MG are provided between SD1 and SD2 each of which functions as a source or a drain.

In addition, the first and second peripheral circuits are configured of a plurality of the p-channel MISFETs and a plurality of the n-channel MISFETs, and each has a source region, a drain region and the gate electrode.

FIGS. 5 to 16 are cross-sectional views of a principal part illustrating a manufacturing process of a memory cell region MC and a peripheral circuit region PC. While the memory cell region MC is a non-volatile memory array section in which the plurality of non-volatile memories are arranged in the matrix form, the manufacturing process will be described by using one non-volatile memory of the plurality of non-volatile memories in the cross-sectional views of the principal part. The other non-volatile memories also have the same structure, and are formed by using the same manufacturing method.

In addition, the peripheral circuit region PC is a region for forming the plurality of p-channel MISFETs and the plurality of n-channel MISFETs, which configure the first and second peripheral circuits, and the cross-sectional views of the principal part illustrate one n-channel MISFET of the MISFETs. However, the other n-channel MISFETs also have the same structure basically, and are formed by using the same manufacturing method. The non-volatile memory and the n-channel MISFET are formed on the main surface of the same semiconductor substrate SB.

Figure 5:
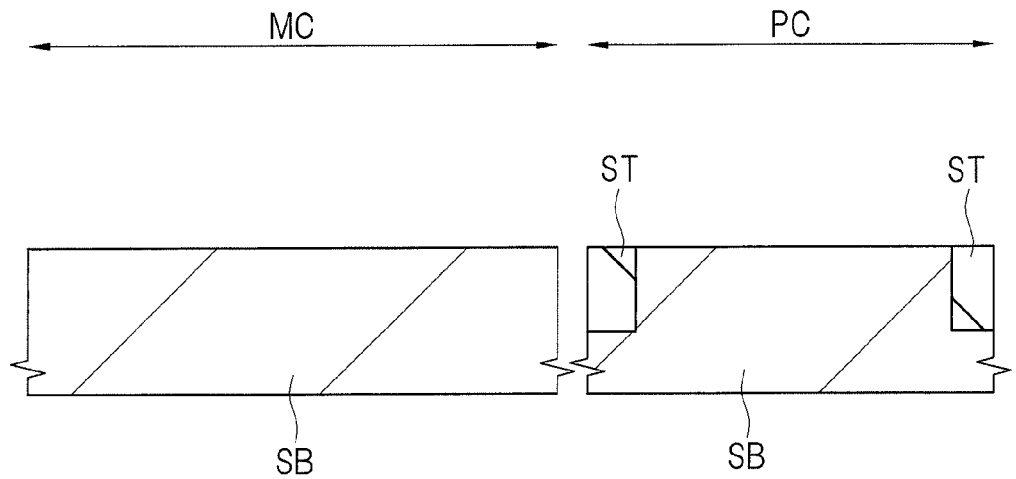
FIG. 5 is a cross-sectional view of a principal part during a manufacturing process of a semiconductor device according to a second embodiment.

First, a preparation step of the semiconductor substrate SB and a step of forming the element isolation region ST illustrated in FIG. 5 are the same as those of the first embodiment. The cross-sectional view of the principal part illustrates the element isolation region ST only in the peripheral circuit region PC. Although not illustrated, the element isolation region ST and the active region exist also in the memory cell region MC.

Figure 6:
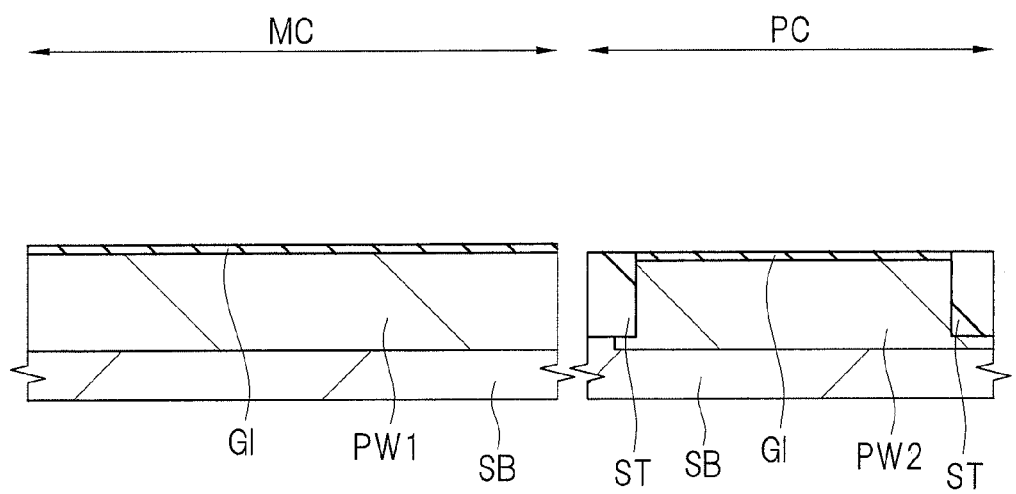
FIG. 6 is a cross-sectional view of a principal part during the manufacturing process of the semiconductor device, continued from FIG. 5.

Next, as illustrated in FIG. 6, a p-type well PW1 is formed in the memory cell region MC of the semiconductor substrate SB, and a p-type well PW2 is formed in the peripheral circuit region PC thereof. The plurality of non-volatile memories are formed in one p-type well PW1, and the plurality of n-channel MISFETs are formed in one p-type well PW2. The p-type wells PW1 and PW2 can be formed by ion implantation of a p-type impurity such as boron (B) into the semiconductor substrate SB.

Next, the insulating film GI for the gate insulating film is formed on the main surface (each surface of the p-type wells PW1 and PW2) of the semiconductor substrate SB. The insulating film GI is formed so as to have a film thickness of, for example, about 2 to 3 nm by using a silicon oxide film, a silicon oxynitride film, or others. The insulating film GI of the peripheral circuit region PC may be formed in a different step from that of the insulating film GI in the memory cell region MC, and the insulating film GI in the peripheral circuit region PC may be formed to be thicker or thinner than the insulating film GI in the memory cell region MC, or, to have both of the thick and thin film thicknesses.

Figure 7:
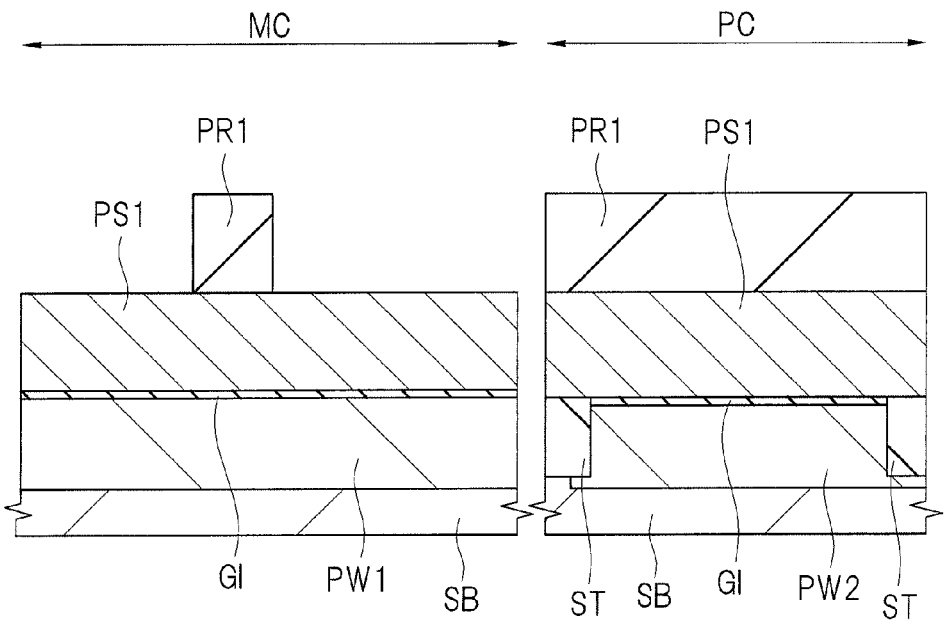
FIG. 7 is a cross-sectional view of a principal part during the manufacturing process of the semiconductor device, continued from FIG. 6.

Next, as illustrated in FIG. 7, a polysilicon film PS1 serving as a conductive film for forming the control gate electrode CG is formed on the main surface of the semiconductor substrate SB so as to have a film thickness of about 50 to 250 nm. The polysilicon film PS1 also serves as the conductive film for forming the gate electrode of the p-channel MISFET and the n-channel MISFET in the peripheral circuit region PC.

Figure 8:
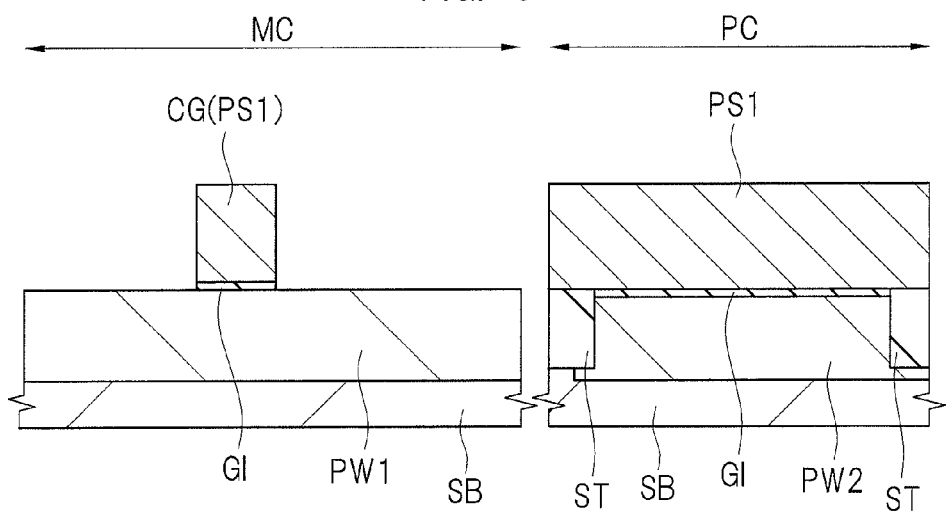
FIG. 8 is a cross-sectional view of a principal part during the manufacturing process of the semiconductor device, continued from FIG. 7.

Next, the polysilicon film PS1 is patterned by using a photolithography technique and an etching technique, so that the control gate electrode CG is formed in the memory cell region MC. First, as illustrated in FIG. 7, the resist mask PR1 is formed on the polysilicon film PS1 by using a photolithography method. Then, the polysilicon film PS1 is patterned by the dry etching while using the resist mask PR1 as the etching mask. Thereafter, the resist mask PR1 is removed. In this manner, as illustrated in FIG. 8, the control gate electrode CG formed of the patterned polysilicon film PS1 is formed.

In the semiconductor device, the gate electrodes of the p-channel MISFET and the n-channel MISFET configuring the first and second peripheral circuits are formed after forming the control gate electrode CG and the memory gate electrode MG of the non-volatile memory.

Therefore, in the etching process for forming the control gate electrode CG, the peripheral circuit region PC is covered by the resist mask PR1, and therefore, the gate electrodes of the p-channel MISFET and the n-channel MISFET in the peripheral circuit region PC are not processed in this stage.

In addition, since there is a case in which a capacity (the number of bits) of the non-volatile memory required for the semiconductor device is not large so much, the area occupied by the non-volatile memory array in the chip region which is the formation region of one semiconductor device is small. Therefore, the opening ratio of the resist mask PR1 in the etching process of the control gate electrode CG is small and is, for example, about 5 to 15% to be equal to or smaller than 20%. Therefore, the end point detection technique cannot be used in the dry etching process of the control gate electrode CG, and the time-controlled etching which previously calculates the etching time to end the etching of the polysilicon film PS1 is performed.

That is, the etching process of the control gate electrode CG corresponds to the second dry etching of first embodiment. The semiconductor device provided with the non-volatile memory corresponds to the second wafer, and the first wafer of FIG. 1 may be a semiconductor device which is totally different from the semiconductor device provided with the non-volatile memory, and may be the semiconductor device provided with the non-volatile memory having a large capacity acquired by processing the control gate electrode CG by using the resist mask PR1 with the opening ratio being larger than 20%.

In addition, a step of measuring a film thickness of the polysilicon film PS1, which has been actually deposited, is provided after the step of forming the polysilicon film PS1 in FIG. 7. Incidentally, a measurement result has been 210 nm while a set film thickness is 200 nm. Here, the control gate electrode CG in FIG. 8 is formed by determining an etching rate and an etching time of the polysilicon film PS1 for the control gate electrode CG depending on the etching rate of the dry-etched polysilicon film by using the resist mask PR1 with the large opening ratio in a product totally different from the semiconductor device provided with the non-volatile memory, and then, by performing the time-controlled etching.

Figure 9:
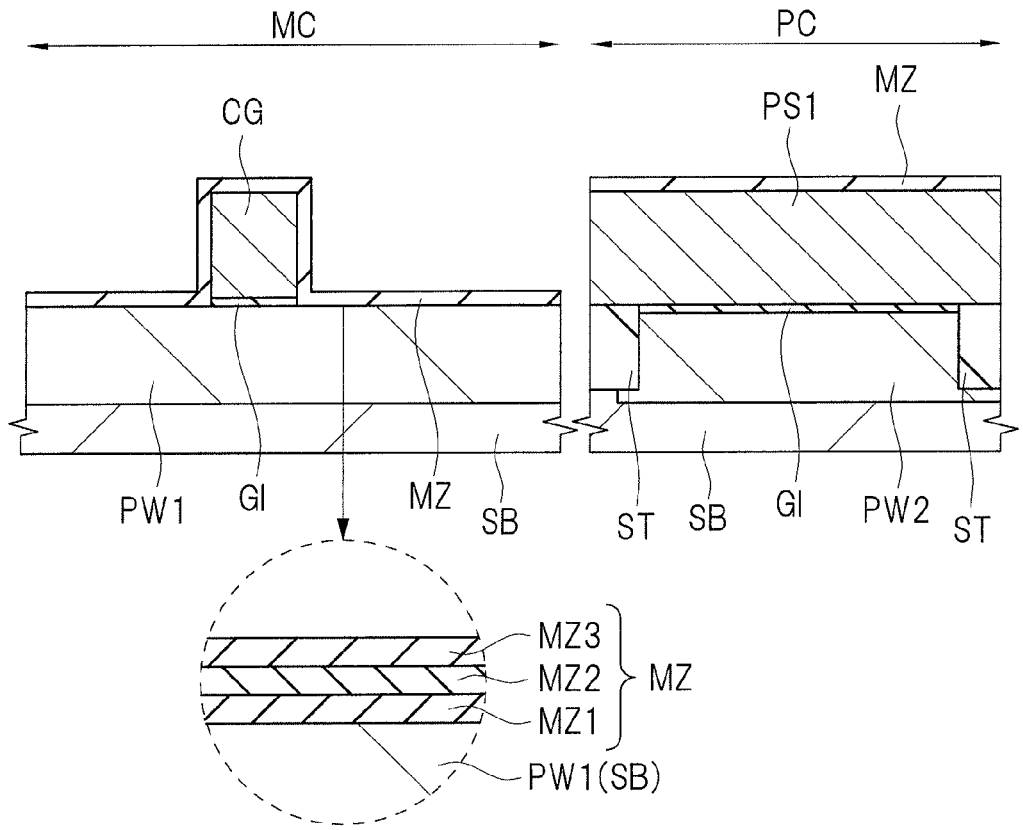
FIG. 9 is a cross-sectional view of a principal part during the manufacturing process of the semiconductor device, continued from FIG. 8.

Next, as illustrated in FIG. 9, an insulating film MZ for a gate insulating film of a memory transistor is formed on the main surface of the semiconductor substrate SB and a surface of the control gate electrode CG. Since the polysilicon film PS1 remains in the peripheral circuit region PC, the insulating film MZ is formed also on the surface of the polysilicon film PS1.

The insulating film MZ is an insulating film for the gate insulating film of the memory transistor, and the insulating film MZ is formed of a stacked film of a silicon oxide film (oxide film) MZ1, a silicon nitride film (nitride film) MZ2 formed on the silicon oxide film MZ1, and a silicon oxide film (oxide film) MZ3 formed on the silicon nitride film MZ2. The silicon nitride film MZ2 has a charge storage function, and the silicon oxide film MZ1 and the silicon oxide film MZ3 have a function of preventing the charge from escaping from the silicon nitride film MZ2. In order to make the drawings easy to see, note that the insulating film MZ formed of the silicon oxide film MZ1, the silicon nitride film MZ2 and the silicon oxide film MZ3 is illustrated simply as the insulating film MZ in FIG. 10 and the subsequent drawings.

A thickness of the silicon oxide film MZ1 can be set to, for example, about 2 to 10 nm, a thickness of the silicon nitride film MZ2 can be set to, for example, about 5 to 15 nm, and a thickness of the silicon oxide film MZ3 can be set to, for example, about 2 to 10 nm.

Figure 10:
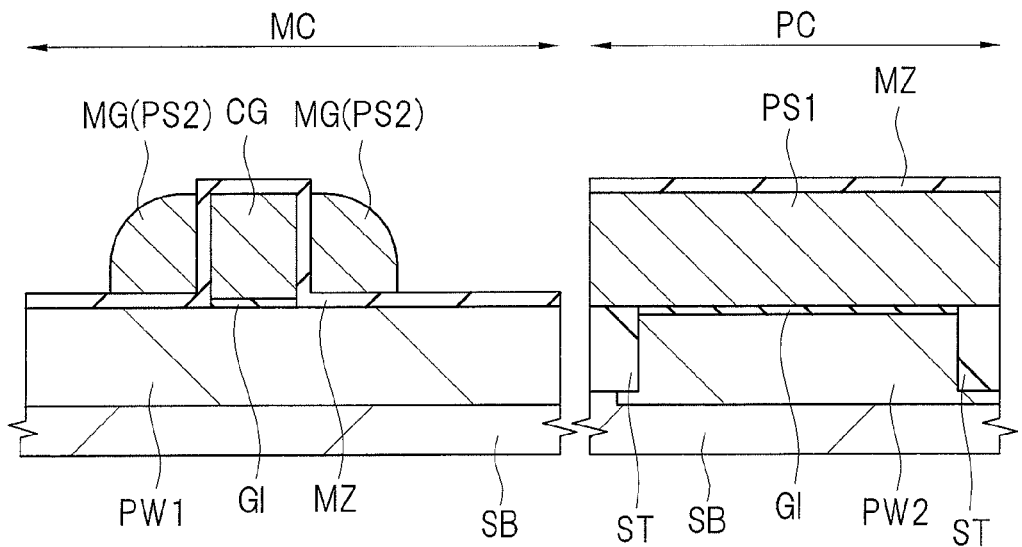
FIG. 10 is a cross-sectional view of a principal part during the manufacturing process of the semiconductor device, continued from FIG. 9.

Next, a polysilicon film PS2 is etched back (anisotropically etched) by forming the polysilicon film PS2 as a conductive film for forming the memory gate electrode MG on the main surface of the semiconductor substrate SB, that is, on the insulating film MZ, and performing anisotropic etching to the polysilicon film PS2, so that the memory gate electrode MG is formed as illustrated in FIG. 10. As seen from FIG. 10, the memory gate electrode MG is formed on sidewalls of the control gate electrode CG and on the semiconductor substrate SB through the insulating film MZ.

Figure 11:
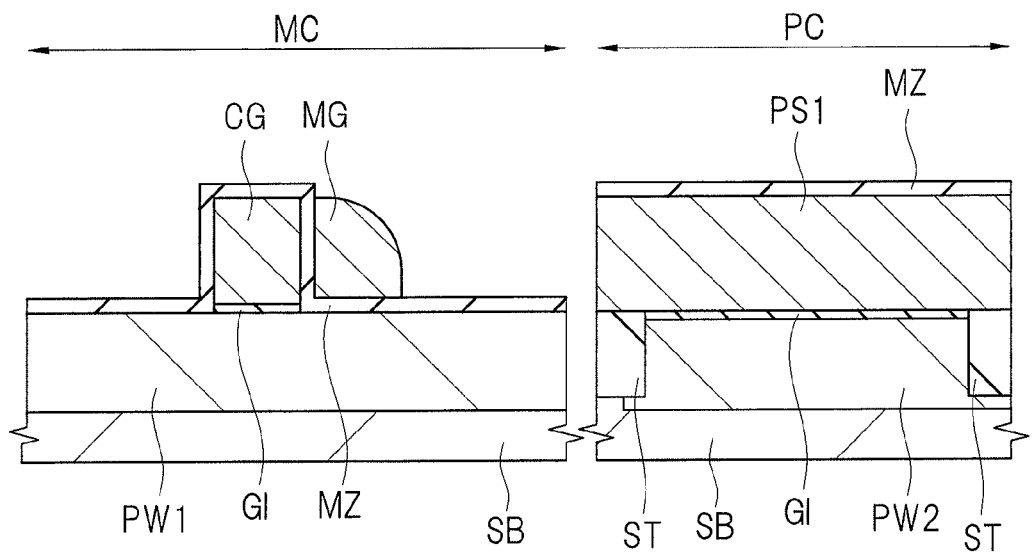
FIG. 11 is a cross-sectional view of a principal part during the manufacturing process of the semiconductor device, continued from FIG. 10.

Next, a resist pattern (not illustrated) covering the control gate electrode CG and one of the memory gate electrodes MG is formed, and the other memory gate electrode MG is removed by using the resist pattern as a mask, so that a structure in which the memory gate electrode MG is formed only on one sidewall of the control gate electrode CG is provided as illustrated in FIG. 11.

Figure 12:
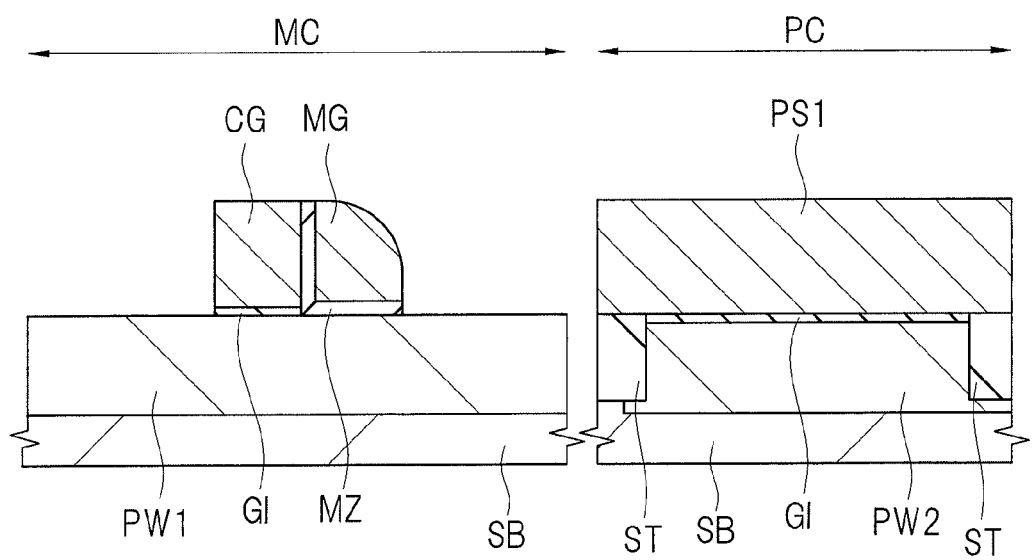
FIG. 12 is a cross-sectional view of a principal part during the manufacturing process of the semiconductor device, continued from FIG. 11.

Next, as illustrated in FIG. 12, a part of the insulating film MZ, which is not covered by the memory gate electrode MG but is exposed, is removed by the etching. At this time, in the memory cell region MC, the insulating films MZ positioned below the memory gate electrode MG and between the memory gate electrode MG and the control gate electrode CG are not removed but remain. At this time, the insulating film MZ of the peripheral circuit region PC is also removed from the surface of the polysilicon film PS1.

Figure 13:
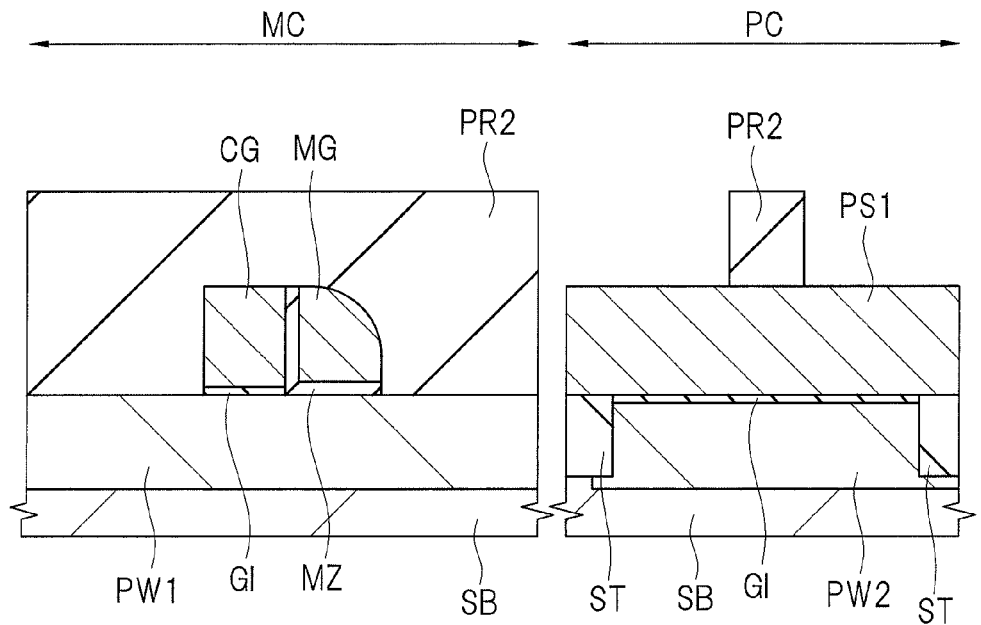
FIG. 13 is a cross-sectional view of a principal part during the manufacturing process of the semiconductor device, continued from FIG. 12.
Figure 14:
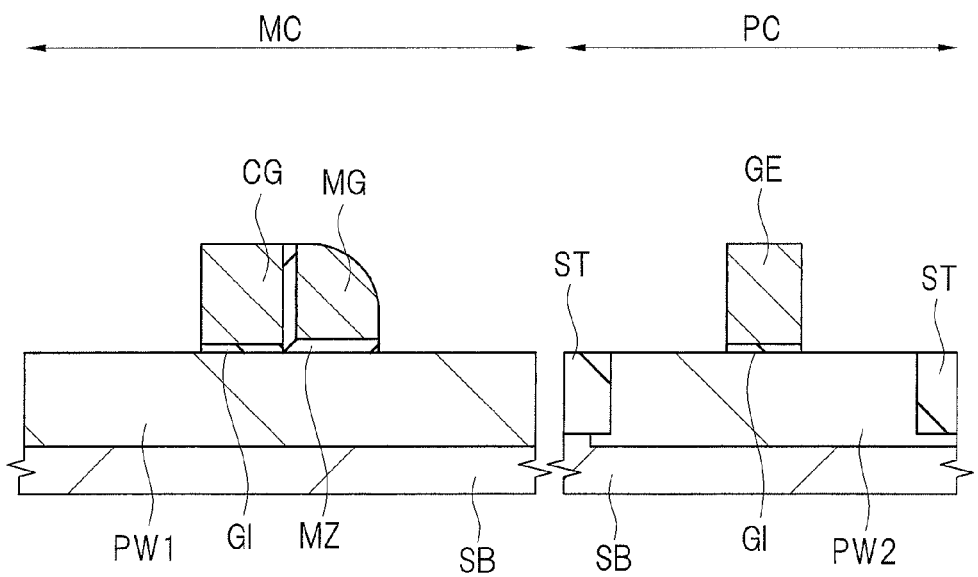
FIG. 14 is a cross-sectional view of a principal part during the manufacturing process of the semiconductor device, continued from FIG. 13.

Next, a gate electrode GE is formed in the peripheral circuit region PC. As illustrated in FIG. 13, the resist mask PR2 is formed on the main surface of the semiconductor substrate SB. Then, the polysilicon film PS1 is subjected to the dry etching to be patterned by using the resist mask PR2 as the etching mask. Thereafter, the resist mask PR2 is removed. In this manner, as illustrated in FIG. 14, the gate electrode GE made of the patterned polysilicon film PS1 is formed.

Figure 15:
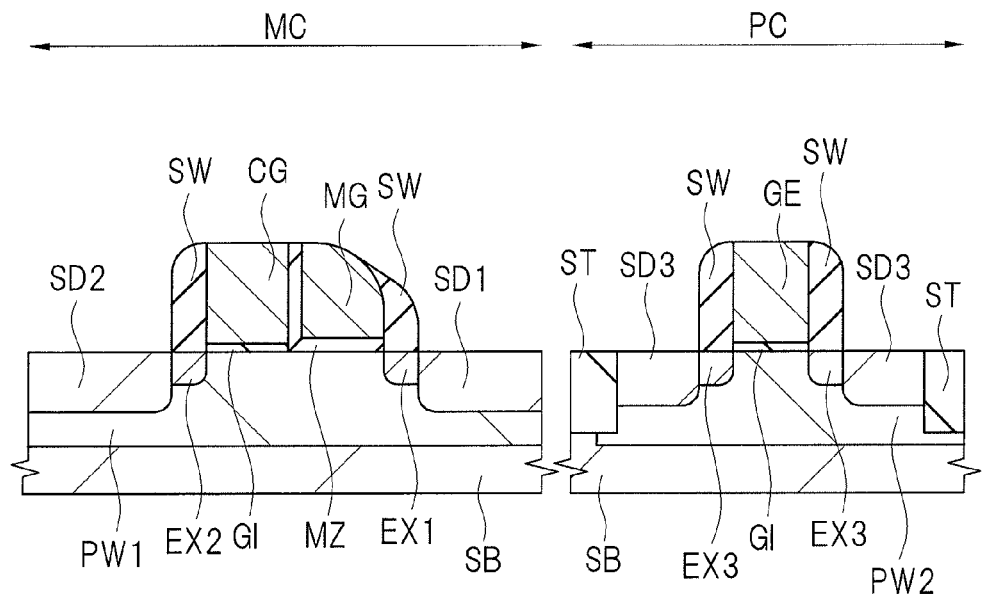
FIG. 15 is a cross-sectional view of a principal part during the manufacturing process of the semiconductor device, continued from FIG. 14.

Next, as illustrated in FIG. 15, n$^-$-type semiconductor regions (impurity diffusion layers) EX1, EX2 and EX3 are formed by using an ion implantation method or others. For example, an n-type impurity such as arsenic (As) or phosphorus (P) is introduced into the semiconductor substrate SB (the p-type wells PW1 and PW2) by using the ion implantation method using the control gate electrode CG, the memory gate electrode MG and the gate electrode GE as masks, so that the n$^-$-type semiconductor regions EX1, EX2 and EX3 can be formed.

Next, as illustrated in FIG. 15, a sidewall spacer SW made of an insulating film is formed on the sidewalls of the control gate electrode CG and the memory gate electrode MG and on sidewalls of the gate electrode GE. The sidewall spacer SW can be formed by, for example, forming an insulating film such as an silicon oxide film on the entire main surface of the semiconductor substrate SB as the insulating film for forming the sidewall spacer SW, and then, performing the anisotropic etching thereto.

Next, as illustrated in FIG. 15, n$^+$-type semiconductor regions SD1, SD2 and SD3 are formed by using the ion implantation method or others. For example, an n-type impurity such as arsenic (As) or phosphorus (P) is used. Because of the implantation into the p-type wells PW1 and PW2 by using the sidewall spacer SW as a mask, the n$^+$-type semiconductor regions SD1, SD2 and SD3 are formed at positions apart from the control gate electrode CG, the memory gate electrode MG and the gate electrode GE farther than the n$^-$-type semiconductor regions (impurity diffusion layers) EX1, EX2 and EX3. In addition, they are formed with higher concentration at deeper positions than the n$^-$-type semiconductor regions (impurity diffusion layers) EX1, EX2 and EX3.

Figure 16:
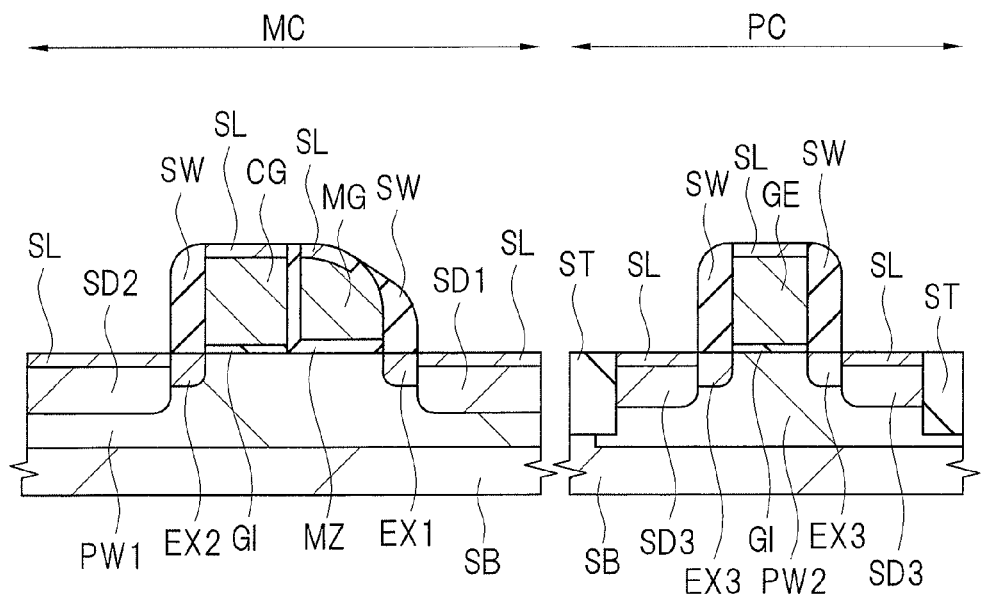
FIG. 16 is a cross-sectional view of a principal part during the manufacturing process of the semiconductor device, continued from FIG. 15.

Next, as illustrated in FIG. 16, a metal silicide layer SL is selectively formed on each upper layer portion (surface layer portion) of the n$^+$-type semiconductor regions SD1, SD2, SD3, the control gate electrode CG, the memory gate electrode MG, and the gate electrode GE. The metal silicide layer SL can be formed of, for example, a cobalt silicide layer, a nickel silicide layer, a platinum-added nickel silicide layer (nickel silicide layer containing platinum), or others.

The non-volatile memory of the present embodiment has such a feature that variation of the processing shape of the control gate electrode CG largely affects the processing shape of the memory gate electrode MG because a sidewall-shaped memory gate electrode MG is provided on the sidewall of the control gate electrode CG, and, for example, a gate length of the memory gate electrode MG is greatly changed.

According to the present embodiment, the etching rate of the dry etching can be set depending on a change of the etching condition caused by the etching apparatus or the accessory equipment when the polysilicon film PS1 for forming the control gate electrode CG is processed in the time-controlled etching, and therefore, the control gate electrode CG can be processed with a high accuracy, and the change of the gate length of the memory gate electrode MG can be prevented or suppressed.

Figure 17A:
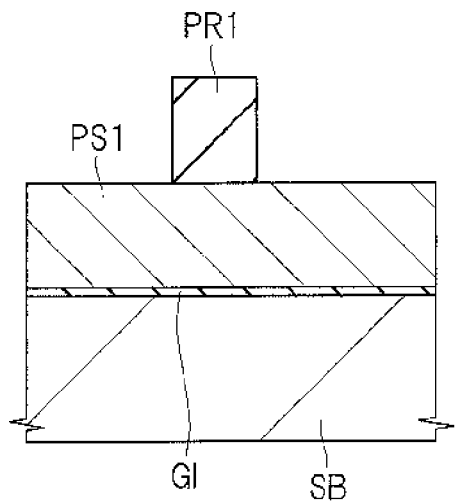
FIGS. 17A to 17C are cross-sectional views of a principal part for describing a dry etching method.
Figure 17B:
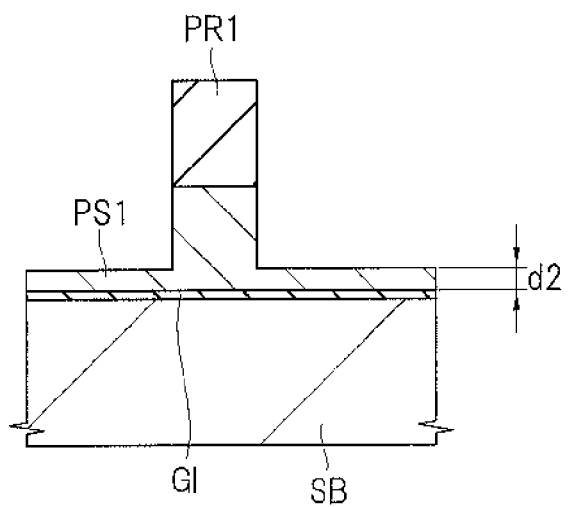
Figure 17C:
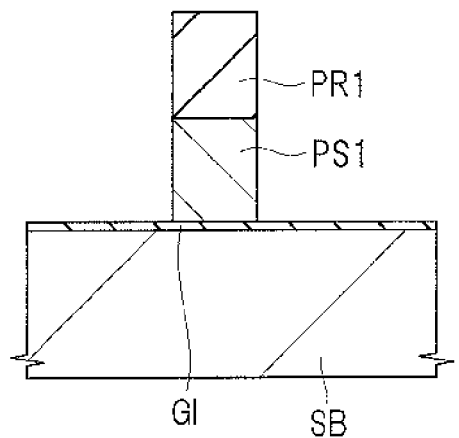

FIGS. 17(a), 17(B), and 17(c) are modified examples of the dry etching of the second polysilicon film PS2 of the first embodiment and the polysilicon film PS1 for forming the control gate electrode of the second embodiment. In FIGS. 17(a), 17(b), and 17(c), a symbol of the polysilicon film is as "PS1" for convenience.

This etching method has such a feature that the polysilicon film PS1 is etched in three stages. First, a first stage is a stage from the start of the dry etching in a state in which the resist mask PR1 is formed on the polysilicon film PS1 as illustrated in FIG. 17(a) to the remaining of the etched film to have a thickness of "d2" (for example, about 50 nm) as illustrated in FIG. 17(b). In the first stage, the etching is performed at high speed under a condition having a small selection ratio of the base with respect to the insulating film GI made of the silicon oxide film or others but having the high etching rate. For example, CH2F2/SF6/N2 gas is used.

Next, as illustrated in FIG. 17(c), the second stage is a step of etching the remaining polysilicon film PS1 of about 50 nm, and is performed by using, for example, HBr/O2 gas under a condition having a higher selection ratio of the base with respect to the insulating film GI than that of the first stage but having a lower etching rate than that of the first stage.

Next, in the third stage, in order to etch the polysilicon film PS1 remaining on the surface of the semiconductor substrate SB and in an STI stepped portion, the etching is performed by using, for example, He/HBr/O2 gas under a condition having a high selection ratio of the base with respect to the insulating film GI but having a further lower etching rate than that of the second stage.

Incidentally, the etching method described with reference to FIG. 1 is effective when being applied to the etching in the first stage. This is because a film thickness of the remaining film for the second stage is changed by the shift of the etching rate in the first stage, which results in the large influence on the final processing shape.

The method of manufacturing the semiconductor device of the present embodiment has an effect of allowing the prevention or the suppression of the change in the processing shape and the dimension of the control gate electrode CG in addition to the effect described in the first embodiment.

In addition, it has an effect of allowing reduction in the variation of the processing dimension and the processing shape of the memory gate electrode MG formed into the sidewall shape on the sidewall of the control gate electrode CG.

In addition, it has an effect of allowing reduction in the change of the threshold value of the non-volatile memory since the variation in the processing dimension and the processing shape of the control gate electrode and the memory gate electrode can be suppressed.

Third Embodiment

The present embodiment describes an example of dry etching by using an end point detection technique using an interference waveform by devising a wafer in the dry etching using an etching mask with a small opening ratio.

Figure 18:
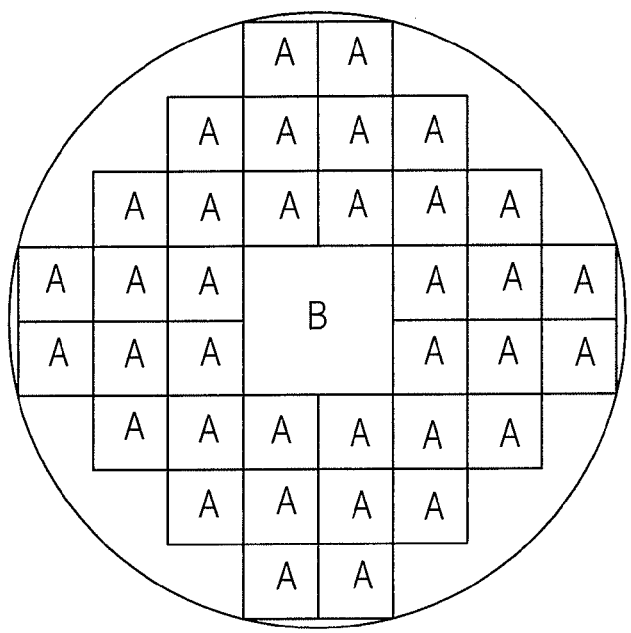
FIG. 18 is a plan view of a semiconductor wafer according to a third embodiment.

FIG. 18 illustrates a wafer which is to be subjected to the dry etching, and a square portion is one chip region where the semiconductor device described in the first or second embodiment is formed. Here, as illustrated in FIG. 3(a), the polysilicon film PS is formed on the surface of the semiconductor substrate SB, and the resist mask PR having a predetermined pattern is formed thereon.

A portion denoted by a symbol "A" in FIG. 18 is a chip region which will be a product, and the etching mask with the small opening ratio is provided in each chip region. A portion denoted by a symbol "B" in FIG. 18 is a dedicated region for performing the end point detection using the interference waveform, and an opening ratio of the portion B is large (for example, larger than 20%).

In this example, the dedicated region for performing the end point detection using the interference waveform occupies a large area, and therefore, this example is disadvantageous in terms of a product acquisition rate. However, this example is advantageous when the small number of acquired products is only required.

A method of manufacturing a semiconductor device according to the present embodiment includes a step of preparing a semiconductor wafer which has the dedicated region with a first opening ratio for the end point detection and the chip region with a second opening ratio for forming a semiconductor device, and a step of performing the dry etching by using the den point detection means using the interference waveform to a conductive film formed on a surface of the semiconductor wafer, and has such a feature that the first opening ratio is larger than the second opening ratio.

Fourth Embodiment

The present embodiment describes an example of dry etching by using an end point detection technique using a light-emission waveform by devising a wafer in the dry etching using an etching mask with a small opening ratio.

As similar to the third embodiment, the polysilicon film PS is formed on the surface of the semiconductor substrate SB, and the resist mask PR having a predetermined pattern is formed thereon.

Figure 19:
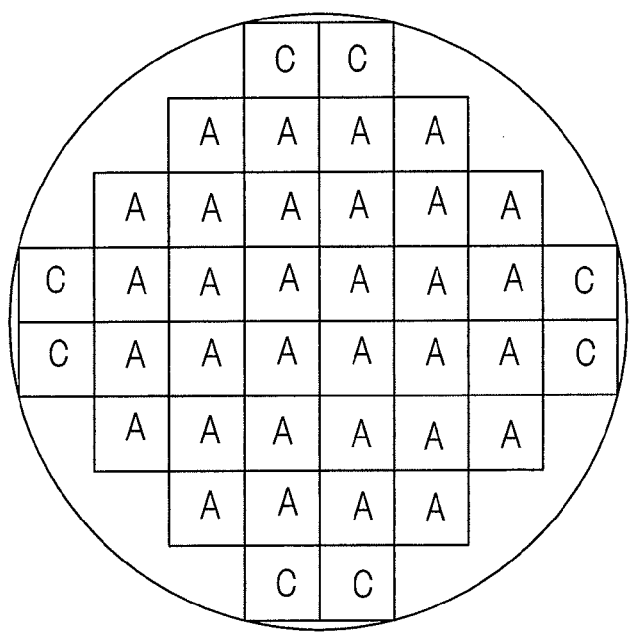
FIG. 19 is a plan view of a semiconductor wafer according to a fourth embodiment.

A portion denoted by a symbol "A" in FIG. 19 is a chip region which will be a product, and the etching mask with the small opening ratio is provided in each chip region. A portion denoted by a symbol "C" in FIG. 19 is a dummy chip region which is a region for increasing the opening ratio obtained when seen in a unit of the wafer, and the region completely exposed from the resist mask PR or the region with the large opening ratio of the resist mask PR.

In the case of the present embodiment, the opening ratio of the etching mask when seen in a unit of the entire wafer surface is large (for example, larger than 20%).

In the case of the end point detection technique using the light-emission waveform, the end point detection is performed by detecting a radical or anion of the etching gas and plasma emission of a reaction product, and therefore, the end point can be detected when the opening ratio of the entire wafer is large.

The dummy chip region may be arranged at any position in the wafer. A wafer outer peripheral portion in which the chip region to be the product cannot be secured can be effectively applied by arranging the dummy chip region in the outer peripheral portion of the wafer.

A method of manufacturing a semiconductor device according to the present embodiment includes a step of preparing a semiconductor wafer which has the dummy chip region with a first opening ratio and a chip region with a second opening ratio for forming a semiconductor device, and a step of performing dry etching by using the end point detection means using the light-emission waveform to a conductive film formed on a surface of the semiconductor wafer, and has such a feature that the first opening ratio is larger than the second opening ratio.

In the first to fourth embodiments described above, the etching mask may include a member other than the resist such as a hard mask made of a silicon oxide film, a silicon nitride film, or others. In addition, the resist mask and the etching mask may also include a stacked layer structure of a resist film and an anti-reflection film (ARC or BARC).

In the foregoing, the invention made by the present inventors has been concretely described based on the embodiments. However, it is needless to say that the present invention is not limited to the foregoing embodiments and various modifications and alterations can be made within the scope of the present invention.

SYMBOL EXPLANATION

CG control gate electrode
D n-type drain region
EX1, EX2, EX3 n⁻-type semiconductor region
G, GE gate electrode
GI insulating film
MC memory cell region
MG memory gate electrode
MZ insulating film
PC peripheral circuit region
PR, PR1 resist mask
PS, PS1, PS2 polysilicon film
PW1, PW2 p-type well
S n-type source region
SB semiconductor substrate
SD1, SD2, SD3 n⁺-type semiconductor region
SL metal silicide layer
ST element isolation region
SW sidewall spacer

The invention claimed is:

1. A method of manufacturing a semiconductor device, the method comprising:
    forming a second conductive film on a second semiconductor substrate; and
    loading the second semiconductor substrate into a dry etching apparatus, and performing a second dry etching to the second conductive film,
    wherein, in the second dry etching, the second dry etching is ended in an etching time calculated by using a second etching rate of the second conductive film, and
    the second etching rate is determined depending on a correlation unique for the dry etching apparatus between an opening ratio of an etching mask and an etching rate and on a first etching rate of a first conductive film calculated in a first dry etching performed to the first conductive film on a first semiconductor substrate which is different from the second semiconductor substrate, prior to the second dry etching;
    wherein, in the second dry etching, a second etching mask with a second opening ratio is formed on the second conductive film,
    in the first dry etching, a first etching mask with a first opening ratio is formed on the first conductive film, and
    the second opening ratio is smaller than the first opening ratio; and
    wherein, the semiconductor device has a memory array including a non-volatile memory having a control gate electrode, a memory gate electrode, a first source region, and a first drain region, and including a peripheral circuit region having a plurality of MISFETs each of which has a gate electrode, a second source region, and a second drain region,
    in the second dry etching, a second etching mask with a second opening ratio is formed on the second conductive film, and
    the peripheral circuit region is covered by the second etching mask when the control gate electrode is processed by the second dry etching of the second conductive film.

2. The method of manufacturing the semiconductor device according to claim 1,
    wherein the second opening ratio is equal to or smaller than 20%.

3. The method of manufacturing the semiconductor device according to claim 1,
    wherein end point detection means are used in the first dry etching.

4. The method of manufacturing the semiconductor device according to claim 1,
    wherein the first conductive film is a first polysilicon film, and the second conductive film is a second polysilicon film.

5. The method of manufacturing the semiconductor device according to claim 1,
    wherein the first dry etching and the second dry etching are performed under a same etching condition.

6. The method of manufacturing the semiconductor device according to claim 1,
    wherein the semiconductor device has a plurality of MISFETs each of which has a gate electrode, a source region, and a drain region, and the gate electrode is formed by the second dry etching of the second conductive film.

7. The method of manufacturing the semiconductor device according to claim 1, further comprising
    forming the gate electrode in the peripheral circuit region by forming a third etching mask on the second conductive film and performing a third dry etching to the second conductive film.

* * * * *